United States Patent [19]

Moore

[11] Patent Number: 4,840,583

[45] Date of Patent: Jun. 20, 1989

[54] AUTOMATIC JUMPER CABLES

[76] Inventor: Donald M. Moore, Rte. 3, Box 109, Warrenton, Va. 22186

[21] Appl. No.: 166,404

[22] Filed: Mar. 10, 1988

[51] Int. Cl.$^4$ ............................................. H01R 11/00
[52] U.S. Cl. .................................... 439/504; 439/420; 340/636; 320/25; 320/48
[58] Field of Search .......................... 320/2, 25, 26, 48; 340/636; 439/502-504, 506, 420, 445

[56] References Cited

U.S. PATENT DOCUMENTS

| | | | |
|---|---|---|---|
| 3,146,053 | 8/1964 | Strock | 439/420 |
| 3,259,754 | 7/1966 | Matheson | 439/504 |
| 3,267,452 | 8/1966 | Wolf | 439/504 |
| 4,447,785 | 5/1984 | Wright | 340/636 |

*Primary Examiner*—P. Austin Bradley
*Attorney, Agent, or Firm*—Leon Gilden

[57] ABSTRACT

An improved jumper cable organization is presented wherein illuminated indication is included to discourage improper connection of the improved jumper cable apparatus to associated batteries. A first embodiment of the invention includes a clamp securable to a jumper cable electrical conductive line wherein a spike is electrically associated with a plurality of LED units such that the spike electrically associated with an associated clamp may be contacted to a remaining terminal of a battery once the three remaining jumper cable clamps are secured to indicate appropriate polarity connection of the jumper cable organization. A second embodiment positions the plural LED elements within the handle of a battery connective clamp where an electrically isolated probe may be contacted to the remaining battery terminal for indication of appropriate polarity. The aforenoted LED elements with inappropriate connection of the jumper cables of the instant invention will illuminate to indicate an inappropriate polarity.

8 Claims, 2 Drawing Sheets

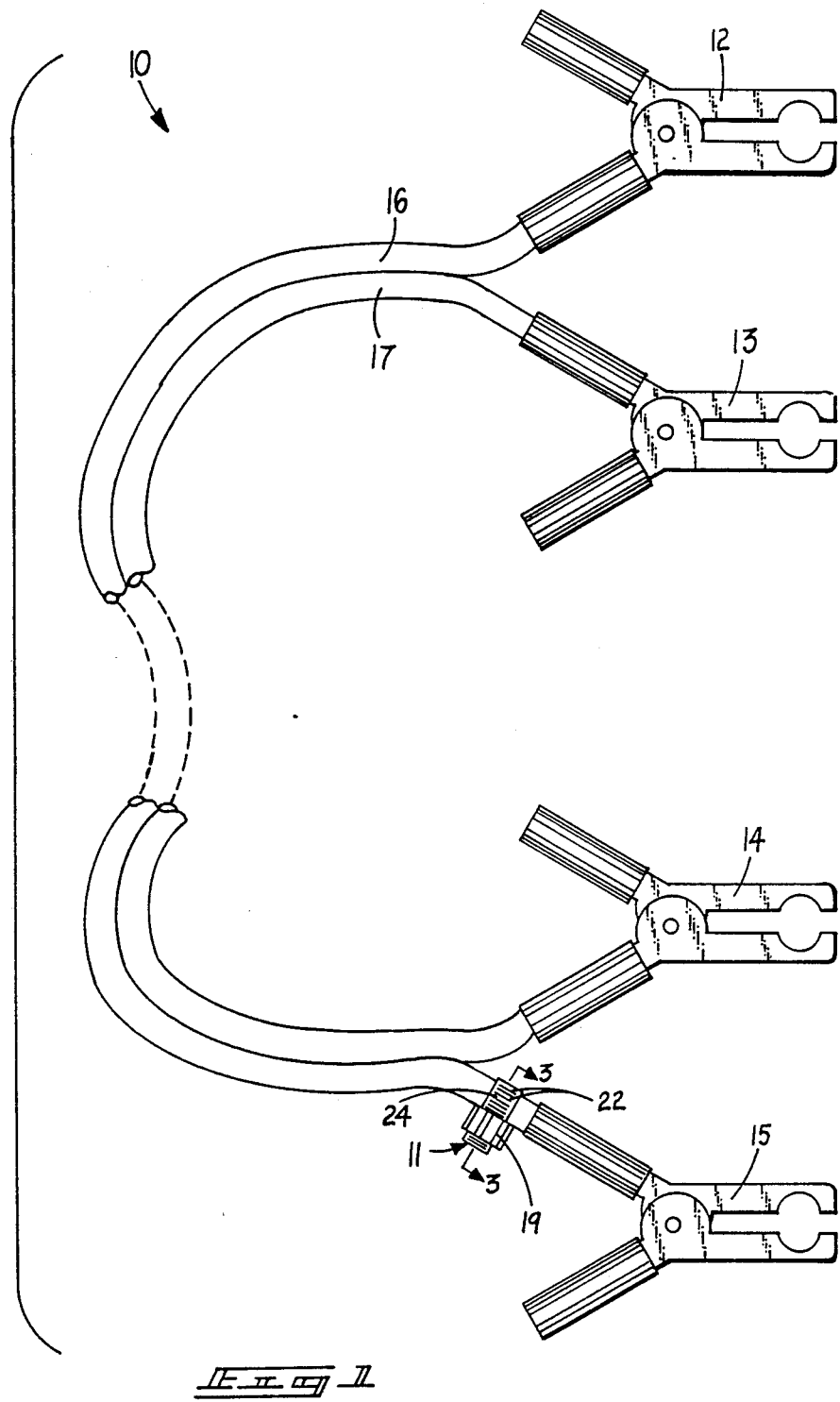

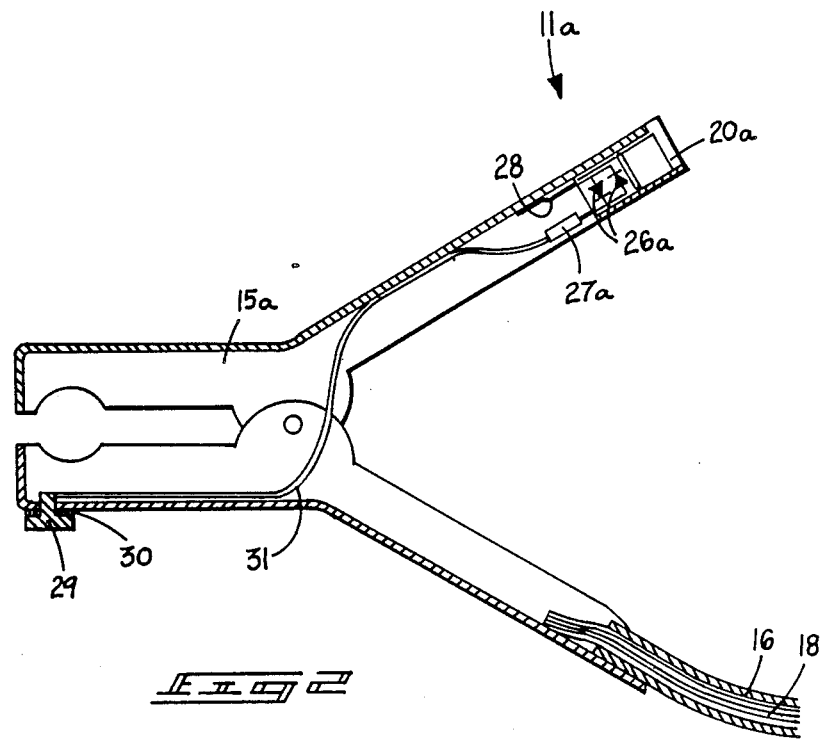
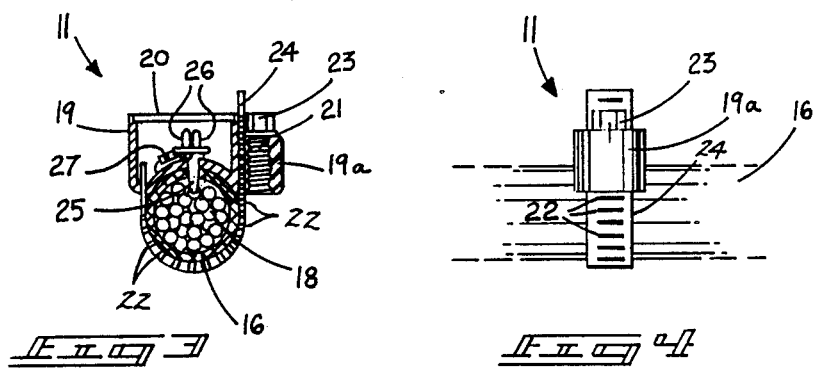

AUTOMATIC JUMPER CABLES

BACKGROUND OF THE INVENTION

1. Field of the Invention

The present invention relates to battery jumper cables, and more particularly pertains to a new and improved automotive battery jumper cable for indication of correct polarity by the illumination of included LED elements upon inappropriate polarity connection between associated batteries.

2. Description of the Prior Art

The use of battery jumper cables is well known in the prior art. As may be appreciated, these devices are potentially hazardous in the creation of arcing at battery terminals with an appropriate connection between a plurality of associated batteries to be connected. In this connection, there have been several attempts to develop jumper cable indicating apparatus which may be utilized to effectively and efficiently indicate appropriate battery connection. For example, U.S. Pat. No. 4,420,212 to Wright sets forth a LED arrangement wherein a series of green and red LED bulbs are associated in a separate housing remote from the battery connection clamps. The bulky and expansive Wright apparatus will tend to discourage the effective use of indication apparatus in the association of battery clamps to associated batteries.

U.S. Pat. No. 3,259,754 to Matheson utilizes an add-on test clamp arrangement wherein by means of spring loaded clamps a bulb will glow upon appropriate connection of a battery clamp air. While an effective solution to indicate appropriate polarity, the Matheson patent utilizes cumbersome apparatus tending to discourage use of such equipment.

U.S. Pat. No. 4,272,142 to Zapf divides the cables connecting battery clamp pairs with a coupling arrangement wherein a circuit is provided in the coupling arrangement for indication of appropriate connection of the battery clamp pairs to visually indicate appropriate clamping arrangement. As in other prior art of this type, the use of separate housing means remote from respective battery clamp pairs creates a more awkward arrangement in use and therefore discourages the use of safety of devices of this type.

U.S. Pat. No. 4,079,304 to Brandenburg provides a jumper cable arrangement including a coupling arrangement associated with a first battery of a first vehicle to ease the connection process to a second battery of a second vehicle but the arrangement of the Brandenburg patent is structurally remote from the instant invention.

U.S. Pat. No. 4,163,134 to Budrose sets forth an indication arrangement for a jumper cable organization wherein a switch associated electrical connection to a battery cable to generally prevent inappropriate connection by enabling time for desired observation of appropriate connection. A timer switch may be associated with the switching arrangement in the Budrose patent. Further embodiments include multiple switching and even logic circuits to determine when cables are appropriately connected but is, as in other prior art devices, of cumbersome and complex organization discouraging the appropriate use of the simplified and improved automotive jumper cable arrangement of the instant invention.

As such, it may be appreciated that there is continuing need for a new and improved jumper cable apparatus which addresses both the problem of effectiveness and ease of use, and in this respect, the present invention substantially fulfills this need.

SUMMARY OF THE INVENTION

In view of the foregoing disadvantages inherent in the known types of automotive jumper cables now present in the prior art, the present invention provides an automotive jumper cables wherein the same may be efficiently and readily positioned for indicating appropriate polarity upon association of respective batteries in an automotive environment. As such, the general purpose of the present invention, which will be described subsequently in greater detail, is to provide a new and improved automotive jumper cable arrangement which has all the advantages of the prior art jumper cables and none of the disadvantages.

To attain this, the present invention comprises an automotive jumper cable apparatus including conventionally arranged pairs of battery clamps for connection to respective batteries. Associated with a single battery clamp is a polarity indicating device including an LED illumination element to glow upon improper connection of the associated battery clamp. The LED element is wired and integrally secured to a handle of the associated battery clamp or alternatively secured to a wire proximate the aforenoted battery clamp including a piercing element to pierce the protective insulating layer of an associated cable.

My invention resides not in any one of these features per se, but rather in the particular combination of all of them herein disclosed and claimed and it is distinguished from the prior art in this particular combination of all of its structures for the functions specified.

There has thus been outline, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is of enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved automotive jumper cables which has all the advantages of the prior art automotive jumper cables and none of the disadvantages.

It is another object of the present invention to provide a new and improved automotive jumper cables which may be easily and efficiently manufactured and marketed.

It is a further object of the present invention to provide a new and improved automotive jumper cables which is of a durable and reliable construction.

As even further object of the present invention is to provide a new and improved automotive jumper cables which is susceptible of a low cost of manufacture with regard to both materials and labor, and which accordingly is then susceptible of low prices of sale to the consuming public, thereby making such automotive jumper cables economically available to the buying public.

Still yet another object of the present invention is to provide a new and improved automotive jumper cables which provides in the apparatuses and methods of the prior art some of the advantages thereof, while simultaneously overcoming some of the disadvantages normally associated therewith.

Still another object of the present invention is to provide a new and improved automotive jumper cable arrangement wherein an associate LED element is electrically connected to an associated battery clamp for indication of improper connection of the jumper cables upon glowing of the LED element.

Yet another object of the present invention is to provide a new and improved automotive jumper cable arrangement wherein the LED element may be hard-wired and integrally associated to a handle of a corresponding jumper cable clamp or alternatively secured to a single cable leading to a clamp by means of a circumferentially compressible clamp to pierce and electrically associate an LED element with conductive wire of said battery connection clamp.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is an orthographic side view of the battery clamp arrangement of the instant invention.

FIG. 2 is a modification of the instant invention illustrating an orthographic elevational view of a battery clamp with the instant invention hard-wired to the clamp.

FIG. 3 is an orthographic cross-sectional view of the instant invention taken along the lines 3—3 of FIG. 1 in the direction indicated by the arrows.

FIG. 4 is an orthographic somewhat enlarged side view of the instant invention.

DESCRIPTION OF THE PREFERRED EMBODIMENT

With reference now to the drawings, and in particular to FIGS. 1, 2, 3 and 4 thereof, a new and improved automotive jumper cables embodying the principles and concepts of the present invention and generally designated by the reference numeral 10 will be described.

More specifically, it will be noted that the automotive jumper cables 10 essentially comprise in conventional pair of battery connector pairs including a first clamp 13 and second clamp 14 cooperative with a second pair of battery connected clamps including a third clamp 12 and a fourth clamp 15. Conventionally, respective clamps 12 and 13 are associated with respective terminals of an automotive battery (not shown) as are paired clamps 14 and 15. Third and fourth clamps 12 and 15 are electrically joined by a first conductive cable 16 with second clamp 14 electrically associated with first clamp 13 by means of second conductive cable 17. FIG. 1 illustrates a polarity indicator module 11 secured electrically to first conductive cable 16 by manner and means to be discussed below. The indicator module 11 includes a housing 19 secured to first conductive cable 16 by torque strap 24 including a series of opening slits 22.

Attention to FIG. 3 will illustrate that opening slits 22 cooperate with threaded torquing bolt 21 formed of threads having a pitch equal to the spacing of opening slits 22 to enable tightening and untightening of the indicator module 11 about an associated conductive cable.

Conductive cable 16 conventionally includes a non-conductive insulation about a multi-strand conductor 18. Electrical association of indicator module 11 with the first conductive cable 16, illustrated in FIG. 3, merely includes positioning of torque strap 24 about the aforenoted cable and positioning the strap 24 between housing 19 of the indicator module and a housing adjunct 19a whereupon torquing of the threaded torquing bolt 21 by the bolt head 23 associated therewith secures the housing about the cable and simultaneously enables piercing of the insulation of conductive cable 16 by a conductive spike 25, as illustrated in FIG. 3. Conductive spike 25 enables the passage of electrical energy to a plurality of LED elements 26 formed with a resistor 27 of approximately 1K ohm value electrically associated with the conductive housing 19 whereupon conductive housing 19 is utilized as a probe, to be discussed below. A clear viewing lens 20 is in overlying relationship to the LED elements 26 to enable ease of viewing of the noted elements and afford protection of the elements and simple circuitry to prevent damage thereto in the normal handling of such equipment.

A further modification of the instant invention includes a modified battery connected clamp formed with an integrally associated polarity indicator module 11a. The clamp is formed with a clear viewing lens 20a at an end of an associated handle thereof housing a plurality of LED elements 26a electrically associated to a probe 29 by a probe conductor 31 with a 1K ohm resistor loading 27a in series, as illustrated. The LED elements 26a are conductively associated with handle 15a by a circuit completion wire 28. The probe 29 has formed between the probe and connector clamp 15a an insulator 30 to electrically isolate the probe 29 from handle 15a.

In use, the first, second and third clamps listed as 12, 13 and 14 respectively are associated with respective battery terminals whereas the first paired clamps 12 and 13 are associated with a first battery positive and minus terminal (not illustrated) and the third clamp 14 is associated with a companion battery terminal of a second battery (not shown). Automotive direct current batteries are conventional and include a positive and negative terminal. Should the clamps be malpositioned, the polarity indicator module 11 or 11a may be touched to the remaining battery terminal of the second battery whereby should the LED units remain dark, then the user may ascertain that the battery connection are proper. Should the LED unit illuminate, then the user will be able to readily observe that the polarity is improper and the connection of clamps 14 and 15 to respective terminals may be reversed. The housing 19, 19a and associated strap 24 may be used as a probe, as they are all electrically associated. Alternatively in the use of the embodiment of FIG. 2, the probe 29 is touched to the remaining battery terminal and similarly if the LED elements 26a remain dark, the polarity is proper and the remaining clamp may be fastened to remaining terminal and similarly should the LED elements illuminate, the polarity must be reversed and handles 14 and 15 must be reversed on respective terminals.

The manner of usage and operation of the present invention therefore should be apparent from the above description and accordingly no further discussion the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. An automotive jumper cable apparatus for use with direct current batteries comprising,
   a first electrical conductive cable formed with first and second ends, and a second electrical conductive cable formed with third and fourth ends, and first and fourth battery connector clamps are secured to said first and second ends respectively and second and third connector clamps are electrically secured to said third and fourth ends respectively;
   said first second battery connector clamps comprise a first clamp couple means for attachment to respective terminals with a first direct current battery and said third and fourth battery connector clamps comprise a second couple means for attachment to a second direct current battery, and
   a polarity indicator means electrically associated with said fourth battery connector clamp for testing polarity connection of said first and second battery clamp couples, and
   said polarity indicator means including a LED element means electrically associated with a conductive probe means including an electrical insulator between said probe means and said fourth battery connector clamp;
   said probe means positioned for temporary contact with a remaining battery terminal of said second battery when said first and second battery connector clamps are secured to said first battery and said third battery connector clamp is secured to a single terminal of said second battery, and
   wherein said polarity indicator means includes a torquing strap for securement about said first electrical conductive cable including a spike for penetration into said cable for providing electrical communication between said cable and said LED elements.

2. An automotive jumper cable apparatus as set forth in claim 1 wherein said polarity indicator means includes a housing means for containment of said LED elements with adjunct housing means for containment of a torquing means with said torquing strap positionable between said housing and said adjunct housing means.

3. An automotive jumper cable apparatus as set forth in claim 2 wherein said housing means includes a transparent lens cover overlying said LED elements for protection and visibility of said elements.

4. An automotive jumper cable apparatus as set forth in claim 3 wherein a resistor is electrically positioned between said LED elements and said housing means and said housing means forms at least a part of said probe means.

5. An automotive jumper cable apparatus as set forth in claim 1 wherein said fourth battery connector clamp includes a plurality of jaws securable about a battery terminal with a plurality of handles secured to said jaws with said polarity indicator means is positioned within one of said handles.

6. An automotive jumper cable apparatus as set forth in claim 5 wherein a transparent lens means is secured at a terminal end of one said handles for visual observation of said LED elements.

7. An automotive jumper cable apparatus as set forth in claim 6 wherein said probe means is secured integrally through one of said jaw means and an electrical conductive cable secured between said probe means and its LED elements with a resistor electrically positioned between said LED elements and said probe means.

8. An automotive jumper cable apparatus as set forth in claim 7 wherein said resistor element is of a value of 1K ohms.

* * * * *